US008461451B2

(12) United States Patent
Huang et al.

(10) Patent No.: US 8,461,451 B2
(45) Date of Patent: Jun. 11, 2013

(54) VERTICAL JUNCTION TANDEM/MULTI-JUNCTION PV DEVICE

(75) Inventors: Ying Jun James Huang, Oxford (GB); Stephen Day, Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 1029 days.

(21) Appl. No.: 12/482,606

(22) Filed: Jun. 11, 2009

(65) Prior Publication Data
US 2010/0313941 A1 Dec. 16, 2010

(51) Int. Cl.
*H01L 31/00* (2006.01)
*H01L 21/00* (2006.01)

(52) U.S. Cl.
USPC ........................ 136/255; 438/73; 257/E21.158

(58) Field of Classification Search
USPC ........................ 136/255; 438/73; 257/E21.158
See application file for complete search history.

(56) References Cited

U.S. PATENT DOCUMENTS

| 4,272,641 | A | 6/1981 | Hanak |
| 6,518,494 | B1 * | 2/2003 | Shibuya et al. ............... 136/261 |
| 2006/0207647 | A1 | 9/2006 | Tsakalakos et al. |
| 2007/0111368 | A1 | 5/2007 | Zhang et al. |
| 2008/0169017 | A1 | 7/2008 | Korevaar et al. |
| 2008/0178924 | A1 * | 7/2008 | Kempa et al. ................. 136/244 |
| 2010/0147365 | A1 * | 6/2010 | DeSimone et al. ........... 136/255 |

FOREIGN PATENT DOCUMENTS

WO   WO 2008/018936   * 2/2008

* cited by examiner

*Primary Examiner* — Jonathan Johnson
*Assistant Examiner* — Tamir Ayad
(74) *Attorney, Agent, or Firm* — Renner, Otto, Boisselle & Sklar LLP

(57) ABSTRACT

A vertical multi-junction photovoltaic device includes a structured substrate including a plurality of substantially vertical elongated structures protruding from a planar surface of the structured substrate. An areal density of the elongated structures at a first sliced plane parallel to the planer surface is different than an areal density of the elongated structures at a second sliced plane parallel to the planar surface. The device further includes least a first sub-cell and a second sub-cell, each having a corresponding vertical p-n or p-i-n junction formed of conformal layers, the first sub-cell being formed in a first region incorporating the first sliced plane and the second sub-cell being formed above the first sub-cell in a second region incorporating the second sliced plane.

27 Claims, 17 Drawing Sheets

Type I

Type II

VERTICAL JUNCTION TANDEM/MULTI-JUNCTION PV DEVICE

TECHNICAL FIELD

This invention generally relates to a tandem/multi-junction photovoltaic (PV) device in which at least two sub-cells within the device have vertical p-n or p-i-n junctions. Vertical p-n or p-i-n junctions are formed as a result of substantially conformal deposition of layers on a structured substrate.

DEFINITION OF TERMS

Elongated Structure
    An elongated structure as referenced herein refers to a three dimensional object protruding off a planar body.
Scaffolding Structure
    A scaffolding structure is an elongated structure on which there will be material deposited.
Protruding Direction
    The direction which the elongated structure protrudes off the planar body.
Vertical Structure
    A vertical structure is a sub-class of the elongated structure, in which its protruding direction is perpendicular to the planar body.
Substantially Vertical Structure
    A substantially vertical structure is a sub-class of the elongated structure, in which the protruding direction of the structure is at an angle to the normal of the planar body, where the angle takes the value between 0 degree to 45 degrees.
Substantially Vertical Pillar
    Substantially vertical pillar is a sub-class of the substantially vertical structure, whose dimension along the protruding direction is larger than the other two dimensions along the directions that are orthogonal to the protruding direction, i.e. at a ratio excess 2:1.
Substantially Vertical Fin
    Substantially vertical fin is a sub-class of the substantially vertical structure, whose dimension along the protruding direction is larger than one of the other two dimensions along the directions that are orthogonal to the protruding direction, i.e. at a ratio excess 2:1.
Substrate
    A substrate as referenced herein is defined as the body on which the first layer of the thin film belonging to a sub-cell or a cell is deposited. The body can be made of a single material or a combination of materials. For example, both a sheet of glass and a sheet of glass coated with transparent conducting oxide are substrates according to this definition.
Structured Substrate
    A substrate containing elongated structures on its surface.
Additive Method (e.g. Deposition, Transfer):
    1. Material deposition methods including, but not restricted to, direct or indirect thermal evaporation, sputter deposition, chemical vapour deposition, spin coating, and ink-jet printing.
    2. Transfer methods including, but not restricted to, dry transfer methods such as stamp-based transfers, device bonding, as well as wet transfer methods where the transfer of the desired structures occurs out of solution.
Subtractive Method (e.g. Etching, Sputtering, Dissolving):
    1. Material etching including wet-chemical etching and dry etching (e.g. reactive ion etching). Dry etching techniques may be combined with sputtering techniques.
    2. Sputtering includes ion milling.
Deposition
    The process of coating a substrate with a layer of material.
Thin Film
    Thin films are materials layers with a thickness ranging from 1 atomic layer to layers of tens of microns.
Interlaced Structure
    An interlaced structure comprises two sub-structures, where both sub-structures have elongated features on their surface, and one sub-structure is on top of the other with an optional sub-structure sandwiched between them. The tip of elongated features of the upper sub-structure has to be below the tip of the elongated features of the lower one. (FIG. 1).
a-Si
    Amorphous silicon
μc-Si
    Microcrystalline silicon

BACKGROUND OF THE INVENTION

A solar cell or PV device takes advantage of the material property of semiconductors to convert light energy to electricity. It does this by creating free charge carriers through the absorption of photons. In general terms, the photon cannot be absorbed if its energy is lower than the band gap energy. On the other hand, if the photon has more energy than the band gap energy, the excess energy will be lost in the form of heat. Therefore, only a particular part of solar spectrum can be well absorbed for a chosen semiconductor. The type of solar cell in which only one p-n or p-i-n junction is used is known as single junction solar cell.

The efficiency of a single junction solar cell can be improved by introducing more p-n or p-i-n junctions into the device. In such cell, several sub-cells made of materials of different photoelectric properties are stacked on top of each other. Such cells are known generally as multi-junction solar cells, or specifically, in the case of a cell comprising two or three p-n or p-i-n junctions, as a tandem or triple junction solar cell, respectively. Each sub-cell absorbs a different part of the solar spectrum, hence the overall absorption of the solar cell is increased.

The efficiency of a single junction solar cell can also be improved by using vertical p-n or p-i-n junction. The vertically aligned junction decouples the light absorption depth from the carrier extraction length; therefore more light can be absorbed while simultaneously maintaining high carrier extraction efficiency (FIG. 2). For more detailed explanation, reference is made to "Nanostructured Substrate for Rapid Thin Film growth" (British Patent Application No 0813568.3)

The vertical junction can be formed by first creating scaffolding structures, where the scaffolding structures can be substantially vertical pillars or fins, followed by deposition of an appropriate combination of layers of thin films around the scaffolding structures to form the desired junctions. The scaffolding structures can be made of a conductor, or an insulator or a semiconductor. Either additive or subtractive methods can be applied to form the vertical scaffolding structure on the substrate, Both multi-junctions and vertical junctions offers opportunities to improve the PV device efficiency, it is hence desirable to take advantage of both methods and incorporate vertical junctions into each of the sub-cells of a multi-junction PV device (FIG. 3). By boosting the efficiency of each sub-cell, it will increase the overall performance of a multi-junction PV device even further.

Although incorporating vertical p-n or p-i-n junctions in each sub-cell of the PV device will result in an enhancement of cell efficiency, manufacture of such a structured device is not straight forward; for example, such a process may require forming a set of vertical structures on top of the previous sub-cell for the subsequent structured sub-cell to be formed (FIG. 4). This will introduce cost and complexity into the manufacturing process, which partially or completely offset the value added through gains in efficiency.

This invention enables the formation of vertical junctions in each sub-cell in a cost effective way by introduction of a novel structured substrate. The features on the structured substrate are only formed once before the material for each sub-cell is deposited, and their profile enables the formation of vertical junctions in at least two sub-cells of a multi-junction device.

ACKNOWLEDGEMENT OF THE RELATED ART

U.S. Pat. No. 4,272,641 discloses an amorphous silicon solar cell comprising an active body having a first major surface, wherein the active body includes a plurality of layers of hydrogenated amorphous silicon each having regions of differing conductivity type, each of the layers being arranged in stacked configuration such that the photo-voltages from each of the layers is added, and a transparent, high work function metal cermet layer forming a tunnel junction between each adjacent pair of layers of hydrogenated amorphous silicon; a transparent high work function metal cermet contacting said first major surface; and means for electrically contacting the last mentioned transparent high work function metal cermet. This patent does not disclose the use vertical p-n/p-i-n junction in any of the sub-cells US 2008/0169017 A1 discloses a photovoltaic device where a multilayered film disposed on at least a portion of at least one of the two surfaces of the substrate and a plurality of elongated nanostructures disposed on the multilayered film, wherein a top layer of the multilayered film contacting the plurality of elongated nanostructures is a first tunnel junction layer, and at least one layer disposed over the plurality of elongated nanostructures, wherein the at least one layer is a portion of photovoltaic junction US2007/0111368 A1 discloses a structure consisting of a conductive nanowire electrode on a conductive substrate with a solar cell structure deposited around it.

US2006/0207647 A1 discloses a photovoltaic device including a structure consisting of an array of vertical structures forming a charge separating junction with a second region residing on top of a first structure and a third region made of a transparent conductor residing on top of the second region.

None of the above-discussed conventional devices teach the formation of vertical p-n or p-i-n junctions in more than one sub-cell within a tandem/multi-junction PV device.

SUMMARY OF THE INVENTION

This invention enables the formation of vertical junctions in at least two sub-cells within a multi-junction photovoltaic (PV) device by using a novel, structured substrate. The subsequent films formed around elongated structures on the substrate may be fabricated by any suitable method; this includes but is not limited to atomic layer deposition, molecular beam epitaxy, chemical beam epitaxy, vapour phase epitaxy, chemical vapour deposition, physical vapour deposition, spin coating, ink-jet printing.

The spatial distribution and the dimensions of the elongated structures on the substrate's surface are configured such that they offer at least two distinct regions along the direction perpendicular to the surface of the substrate, where the distinct regions differ from each other by the areal density of elongated structures in a sliced plane parallel to the substrate plane. Thus, the upper and lower boundaries of each region are determined by the upper and lower limits of two such planes with the same areal volume. FIG. 5 shows two examples of such structures and each has three distinct regions with elongated structures having corresponding volume densities.

The present invention includes two preferred types of elongated structures which are sub-classes of the elongated structures described above.

For a Type I structured substrate as referred to herein, the elongated structures are a set of uniformly spaced, substantially vertical structures, and the structure itself has more than one distinct region along its protruding direction. The structures are defined to be a set only when they share the similar structural dimensions, i.e. less than 20% variation in each dimension. The distinct region along the protruding direction is set by the discontinuity in one of the two horizontal dimensions or the shape of the structure, for example a change from a fin-type structure to a pillar-type structure will be classified as two distinct regions.

In Type II structured substrate, the elongated structures are a collection of more than one set of uniformly spaced substantially vertical structures, and the structures of different sets differ from each other by at least their dimensions along the protruding direction.

FIG. 6 illustrates an example of these two different types of structured substrate.

In the case of Type I substrates, the layers of films deposited that form the first sub-cell are preferred to completely fill the volume between the structures in the first region (the label for each region is assigned bottom-up from the substrate surface). In the case of Type II substrates, said layers are preferred to partially, or completely, fill the volume between the shortest structures in the first region, and at least, completely close the gap between nearest neighbouring structures. For the avoidance of doubt the shortest structures are those from the set (e.g., the first set) that has the smallest vertical dimension. Furthermore, the layers of the films around vertical structures are deposited so that the p-doped layer and n-doped layer are interlaced with each other; there could be an optional intrinsic (i) layer between them. An example of each type is illustrated in FIG. 7.

After forming the first sub-cell, for the Type I structure, the structures belonging to the second or next region that are still protruding from the first sub-cell will serve as the scaffolding structures around which the vertical p-i-n/p-n junction of the second sub-cell can form; while for the Type II structure, the volume between the second shortest structures (e.g., the second set) is partially or completely filled so as to, at least, completely close the gap between nearest neighbouring structures to form the second sub-cell. FIGS. 8(a)-8(d) and FIGS. 9(a)-9(b) show the device structure for the Type I and Type II structures, respectively, after forming the second vertical junction sub-cell. FIGS. 8(c) and 8(d) show the cross-section views of the device of Type I along two perpendicular vertical planes, and the vertical structured p-i-n junction in each sub-cell is illustrated.

Additional sub-cells can be formed following the same method as described above, where the number of sub-cells having vertical p-n or p-i-n junction is equal to the number of distinct regions of Type I structures or the number of sets of Type II structures.

In accordance with an aspect of the invention, a vertical multi-junction photovoltaic device is provided. The device includes a structured substrate including a plurality of substantially vertical elongated structures protruding from a planar surface of the structured substrate. An areal density of the elongated structures at a first sliced plane parallel to the planer surface is different than an areal density of the elongated structures at a second sliced plane parallel to the planar surface. The device further includes least a first sub-cell and a second sub-cell, each having a corresponding vertical p-n or p-i-n junction formed of conformal layers, the first sub-cell being formed in a first region incorporating the first sliced plane and the second sub-cell being formed above the first sub-cell in a second region incorporating the second sliced plane.

According to another aspect, each of the elongated structures has a cross-sectional area at the first sliced plane which is different from a cross-sectional area at the second sliced plane.

According to another aspect, each of the elongated structures includes a discontinuity in its structural dimensions in a plane parallel to the planer surface, and the discontinuity defines a boundary between the first region and the second region.

In accordance with another aspect, the elongated structures are uniformly spaced.

According to still another aspect, the elongated structures have the same structural dimensions.

In accordance with another aspect, each elongated structure includes a substantially vertical fin in the first region and at least one substantially vertical pillar formed on top of the fin in the second region.

According to another aspect, a plurality of substantially vertical pillars are formed on top of each fin, and a spacing between neighbouring pillars on a same fin is larger than a spacing between neighbouring fins.

In yet another aspect, a height of the pillars is more than half the difference between the spacing between neighbouring pillars on the same fin and the spacing between neighbouring fins.

According to another aspect, a height of the fins is more than half a spacing between the fins.

In accordance with still another aspect, each elongated structure includes a wider pillar in the first region and a narrower pillar formed on top of the wider pillar in the second region.

According to another aspect, each elongated structure includes a wider fin in the first region and a narrower fin formed on top of the wider fin in the second region.

In yet another aspect, the elongated structures form n sets (where n>1) and each set differs from the other sets at least by dimension along the protruding direction, the first sliced plane incorporating a plurality of the n sets of elongated structures and the second sliced plane incorporating less than the plurality of n sets of elongated structures.

In accordance with another aspect, the device consists of n sub-cells, and each sub-cell is a vertical p-n or p-i-n junction formed of conformal layers formed in relation to a corresponding set of the elongated structures.

According to another aspect, the elongated structures in each of the n sets are either substantially vertical pillars or substantially vertical fins.

According to another aspect, a first set of the n sets includes substantially vertical pillars and a second set of the n sets includes substantially vertical pillars.

According to another aspect, a first set of the n sets includes substantially vertical fins and a second set of the n sets includes substantially vertical fins.

According to another aspect, a first set of the n sets includes substantially vertical pillars and a second set of the n sets includes substantially vertical fins.

In accordance with another aspect, a pitch of the elongated structures belonging to different sets obeys the equation: $d1/a1=d2/a2= \ldots =dn/an$, where 1, 2, ..., n are the labels assigned to each of the n sets; $d1, d2, \ldots, dn$ are the distance between the respective elongated structure and its nearest neighbour or second nearest neighbour within the corresponding set, and $a1, a2, \ldots, an$ are any integer numbers.

In accordance with yet another aspect, the elongated structures of each set are arranged in a lattice.

According to another aspect, a volume between the elongated structures in the first region is filled by the conformal layers making up the first sub-cell.

According to another aspect, a volume between the elongated structures in the second region is filled by the conformal layers making up the second sub-cell.

In accordance with another aspect, the vertical junctions of the first and second sub-cells are interlaced.

In accordance with another aspect, the elongated structures are formed of a conductor, semiconductor, insulator, or combination thereof.

According to another aspect of the invention, a method of making a vertical multi-junction photovoltaic device is provided. The method includes forming a structured substrate including a plurality of substantially vertical elongated structures protruding from a planar surface of the structured substrate, wherein an areal density of the elongated structures at a first sliced plane parallel to the planer surface is different than an areal density of the elongated structures at a second sliced plane parallel to the planar surface. The method further includes forming a first sub-cell by depositing conformal layers of material on the structured substrate which produce a corresponding vertical p-n or p-i-n junction in a first region incorporating the first sliced plane; and forming a second sub-cell by depositing conformal layers of material on the first sub-cell which produce another corresponding vertical p-n or p-i-n junction in a second region incorporating the second sliced plane.

In accordance with another aspect, the method includes forming the structured substrate by: patterning on an original substrate a first set of line masks and a second set of line masks orthogonal to the first set of line masks; removing portions of the first set of line masks not covered by the second set of line masks; selectively anisotropically etching portions of the original substrate not covered by the second set of line masks to form a pattern of fins; removing the second set of line masks to expose the remainder portions of the first set of line masks; and selectively anisotropically etching portions of the original substrate not covered by the remainder portions of the first set of line masks to form pillars on top of fins, the fins incorporating the first sliced plane and the pillars incorporating the second sliced plane.

According to another aspect, the method includes thinning the fins and the pillars on top of the fins.

According to the another aspect, the method includes forming the structured substrate by: fabricating an imprinting stamp having regular features of at least two different depths on a surface; coating an original substrate with a thin layer of curable resist; imprinting the coating with the surface of the imprinting stamp; curing the resist to transfer the reversed features of the imprinting stamp to the original substrate; and anisotropically etching the original substrate to produce at least first and second sets of the elongated structures, each set having a different height, wherein the first sliced plane incorporates at least the first and second sets of the elongated structures, and the second sliced plane incorporates less than the first and second sets of elongated structures.

It is to be understood that the figures provided show a simplified, schematic version of solar cells to illustrate the key features of the present invention. It will be obvious to the person skilled in the art that certain features, for example, additional layers, that are commonly used in photovoltaic devices, but which are omitted here for clarity, may also be included to enable the optimum use of the present invention. These layers may include, but are not limited to: further structured or planar sub-cells, additional planar sub-cells before forming the structured sub-cells, nucleation layers, buffer layers, back surface field layers, tunnel junctions, window layers and contact layers.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE PREFERRED EMBODIMENTS

In the following, the invention is described in more detail. The invention will be described with reference to the drawings in which like reference labels are used to refer to like elements.

In a first embodiment of the invention, a tandem or multi-junction photovoltaic device is disclosed having at least two sub-cells with vertical p-n or p-i-n junctions; wherein the vertical p-n or p-i-n junctions are formed as a result of substantial conformal deposition of layers of films on a structured substrate; and wherein the elongated structures on the structured substrate have at least two distinct regions along their protruding direction and each region is different from each other either by shape or at least one of its three dimensions. For example, an elongated structure composed of a set of pillars on top of a fin has two distinct regions (e.g., Region 1 and Region 2), while an elongated structure composed of a narrower pillar on top of a wider pillar or a narrower fin on top of a wider fin is also considered to have two distinct regions. The elongated structures are preferred to have substantially uniform pitch and height for each distinct region, and they are made of a conductor, or a semiconductor, or an insulator. Additional non-structured planar sub-cells can be formed either before or after forming the structured ones. Each individual sub-cell, including structured and non-structured sub-cells, contains a p-n or p-i-n junction, which includes of a p-doped semiconductor, an optional non-doped semiconductor and an n-doped semiconductor.

Figure 1:
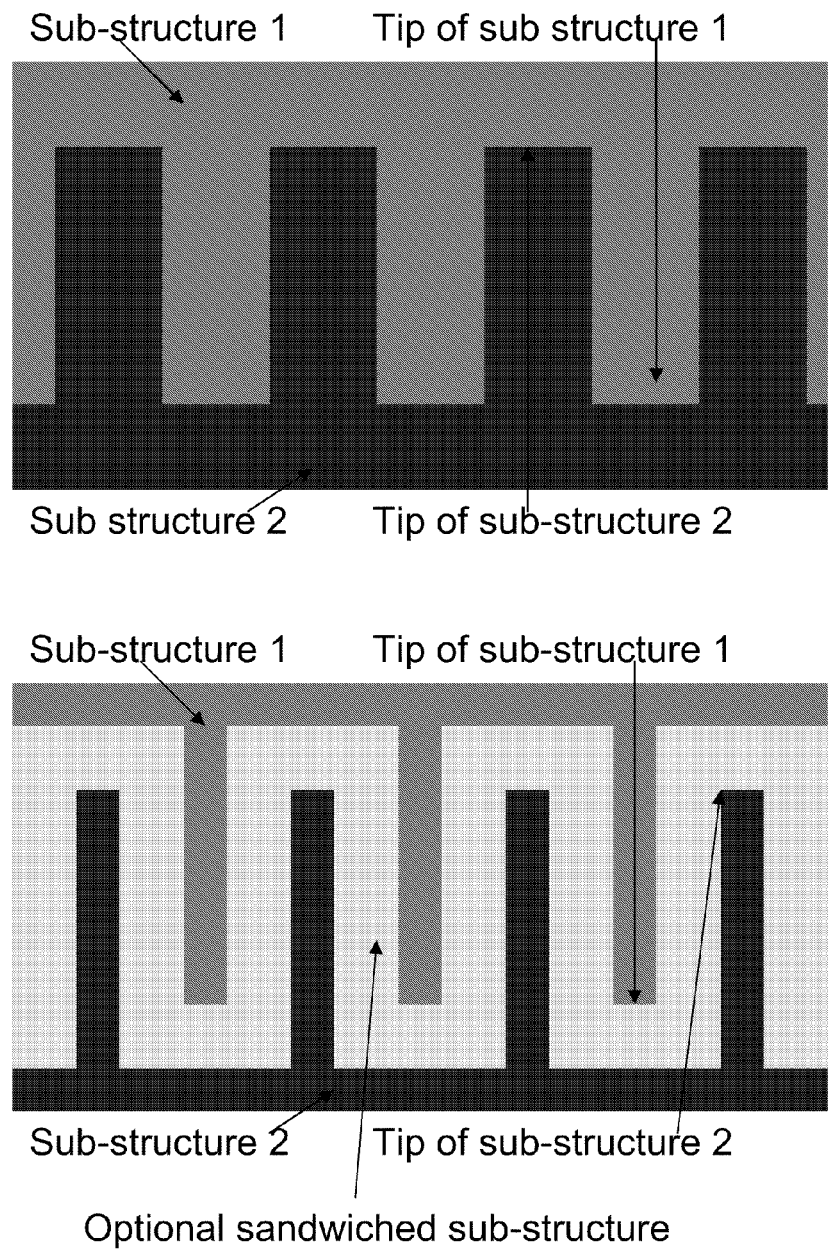
FIG. 1 shows two examples of interlaced structure.
Figure 2:
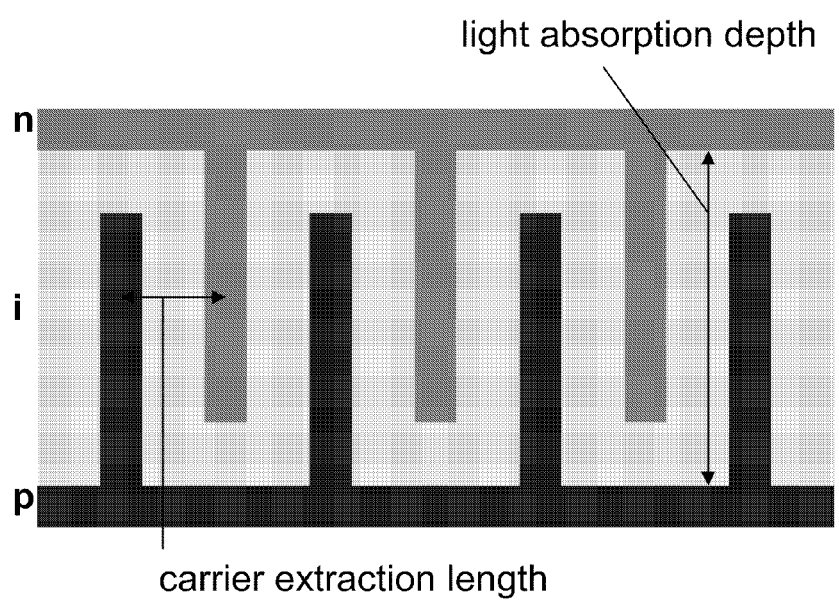
FIG. 2 shows the decoupling of light absorption depth and carrier extraction length in a vertical junction device.
Figure 3:
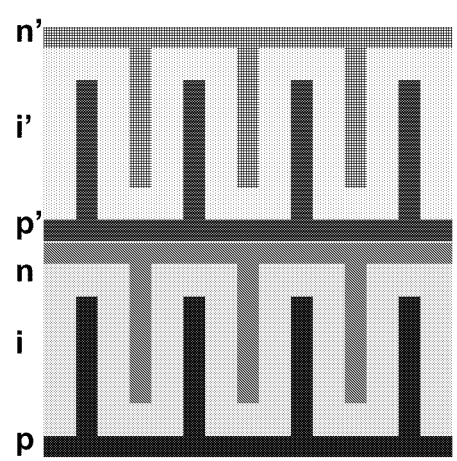
FIG. 3 shows an example of a vertical structured multi-junction PV device.
Figure 4:
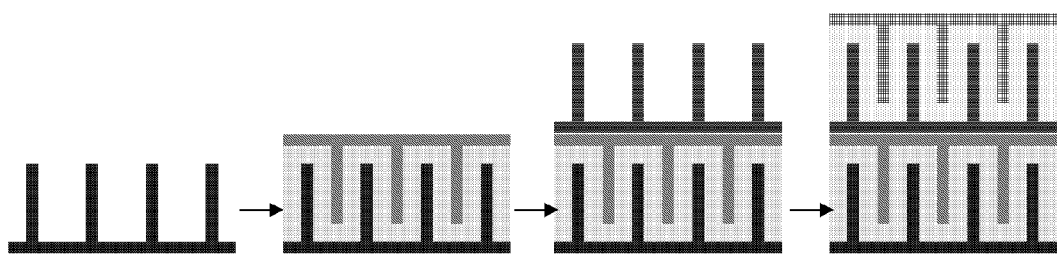
FIG. 4 shows an example of process flow of forming a vertical structured multi-junction PV device.
Figure 5:
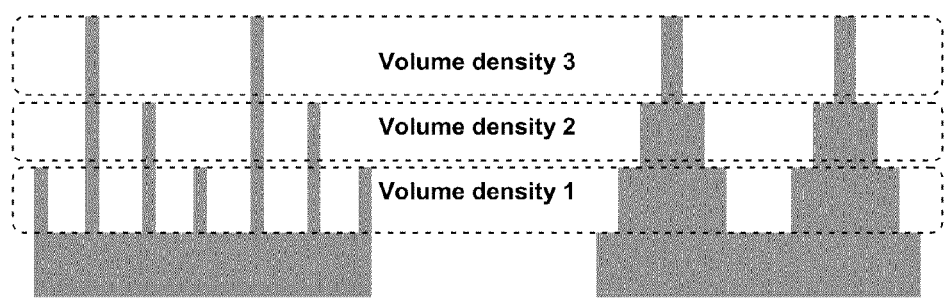
FIG. 5 shows two examples of a structured substrate in accordance with the present invention.
Figure 6:
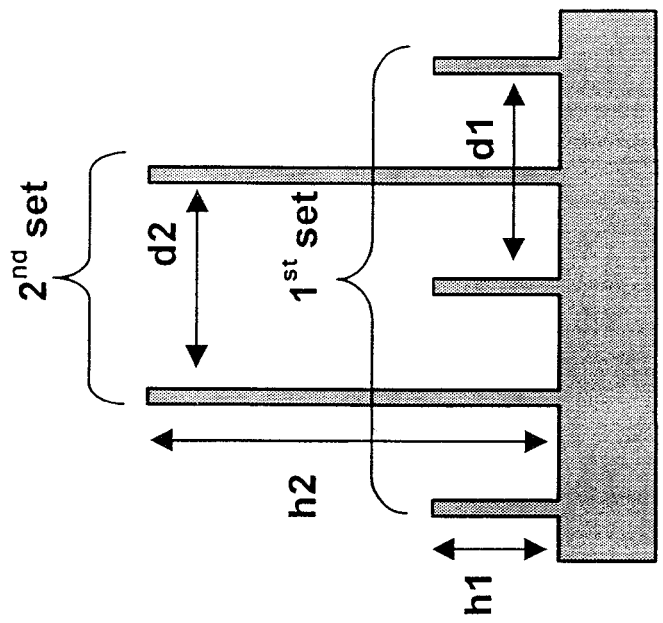
FIG. 6 shows examples of two preferred types of structured substrate in accordance with the present invention.
Figure 6:
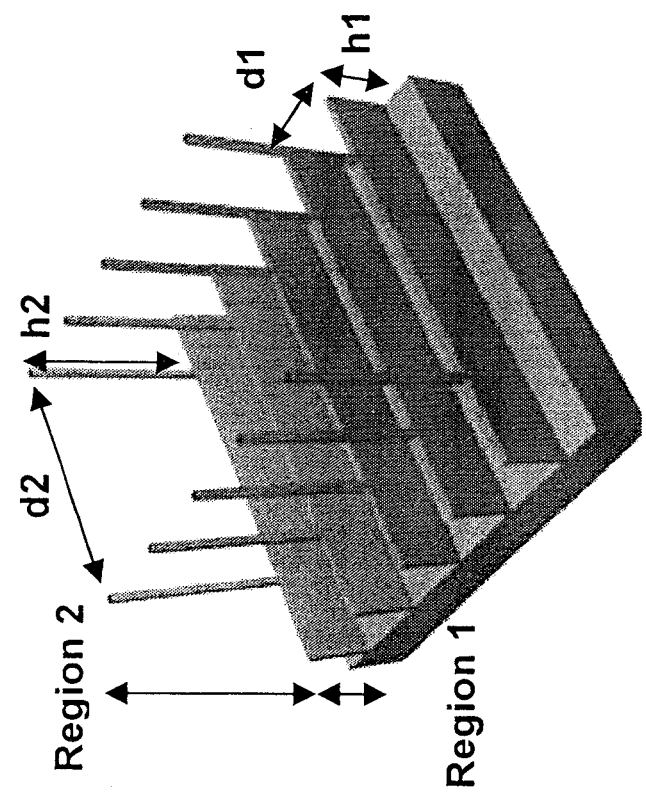
Figure 7:
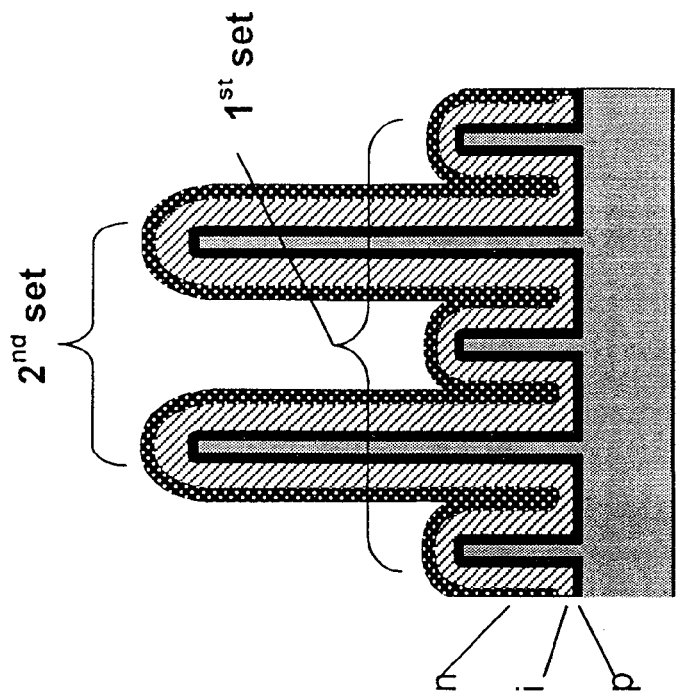
FIG. 7 shows the structural profile of two preferred types of structured substrate after forming first structured sub-cell in accordance with the present invention.
Figure 7:
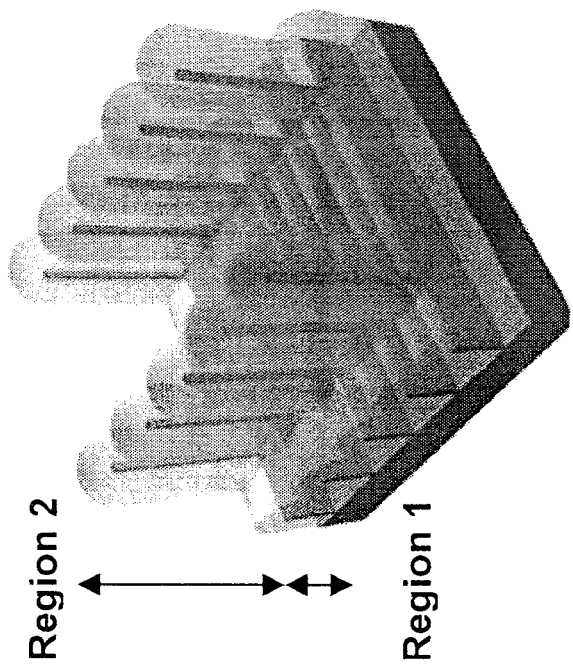
Figure 8:
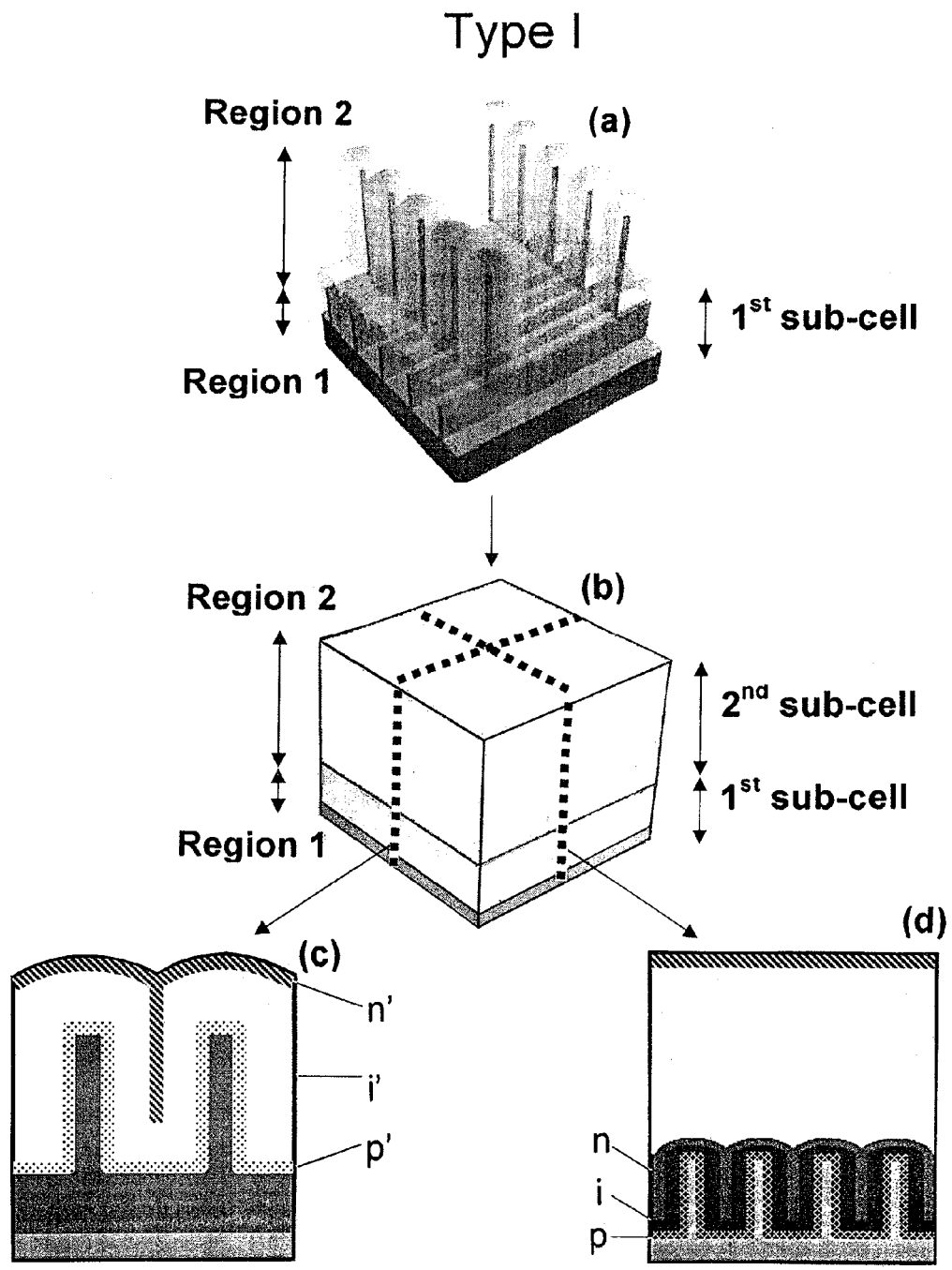
FIG. 8 shows the cross-sectional views of a TYPE I vertical structured multi-junction PV device in accordance with the present invention.
Figure 10:
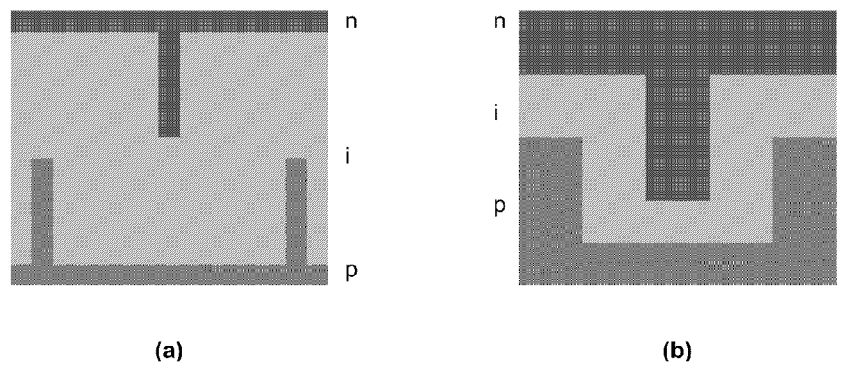
FIG. 10 shows the situation when an inappropriate structural configuration is chosen.

In a second embodiment of the present invention, the first region (Region 1) is represented by a fin structure, while a second region (Region 2) is a set of pillars on top of the fin. This Type I structure is illustrated in FIG. 6 (left). The spacing 'd2' between neighbouring pillars that sit on the same fin has to be larger than the spacing 'd1' between neighbouring fins, if this relation is not obeyed, after forming the first sub-cell in the first region by filling the gaps between neighbouring fins, the gaps between neighbouring pillars will also be filled, and this will prevent formation of the second vertical junction sub-cell in the second region. Furthermore, in the case of a p-i-n junction rather than a p-n junction, where the intrinsic material is the main light absorption material, the height 'h1' of the fins is preferred to be larger than half of the spacing 'd1' between fins; this will insure the possibility of forming interlaced p-doped layer and n-doped layer while ensuring a large proportion of the sub-cell volume is occupied by the intrinsic material. For the same reason, if the second sub-cell uses a p-i-n configuration, the height 'h2' of the pillars is preferred to be larger than half of the spacing after depositing first sub-cell, which is equal to '(d2−d1)/2'. FIG. 10 illustrates the situation when wrong configuration is chosen. In FIG. 10(a), although a large proportion of sub-cell volume is occupied by intrinsic layer, the tips of the n-doped film are now above the tips of the p-doped film, hence they are no longer interlaced with each other. On the other hand, it is still possible to achieve interlaced p- and n-layers by using a thick p/n layer and a thin i-layer (FIG. 10(b)). However, in this case, the volume of the intrinsic layer has been reduced considerably.

Figure 11:
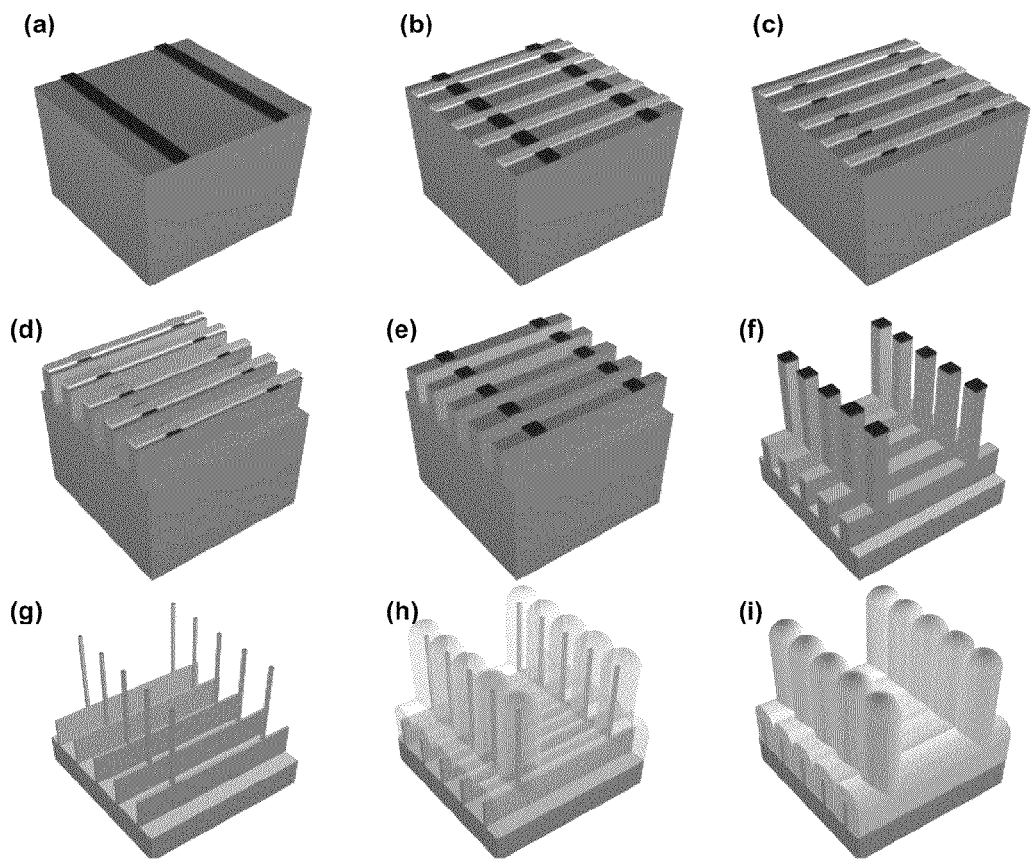
FIG. 11 shows an example of the process flow to form TYPE I structured substrate in accordance with the present invention.

In a third embodiment of the invention, a method is disclosed for forming a Type I structured substrate as described in the previous embodiment. In FIG. 11, a first set of line masks is patterned on the substrate (FIG. 11(a)) followed by a second set of line masks patterned orthogonally to the first (FIG. 11(b)). The pitch and width of the two sets of mask lines may be adjusted to control the pitch and width of the subsequent substrate structures. The portion of the first set of line masks that is not covered by the second set of line masks is removed by suitable etching process (FIG. 11(c)). The first and second set of line masks may differ in their material composition in order to permit the exposed portions of the first mask to be selectively etched by choosing an appropriate method while leaving intact the second mask and the portion of the first mask covered by the second mask. The resulting bi-layer of lines from the second mask and dots from the first mask is used to form the desired structured substrate by the following sequence of steps: Firstly, the substrate is etched using a selective, anisotropic method with the second mask pattern in place. The second mask pattern protects regions of the substrate where anisotropic etching of the substrate is not desired resulting in the formation of a pattern of fins matching the pattern of the second line mask (FIG. 11(d)). Secondly, the line mask layer is removed to expose the dot mask layer (FIG. 11(e)). Thirdly, a second selective anisotropic substrate etch process is performed with the dot mask layer in place. The dot mask pattern protects regions of the substrate where anisotropic etching of the substrate is not desired resulting in the formation of a pattern of pillars matching the pattern of the dot mask (FIG. 11(f)). Optionally the remaining structure may be thinned, for example, by an isotropic etching process, and the final structure is obtained (FIG. 11(g)). FIGS. 11(h) and 11(i) illustrate the device structure after forming the first sub-cell.

Figure 9:
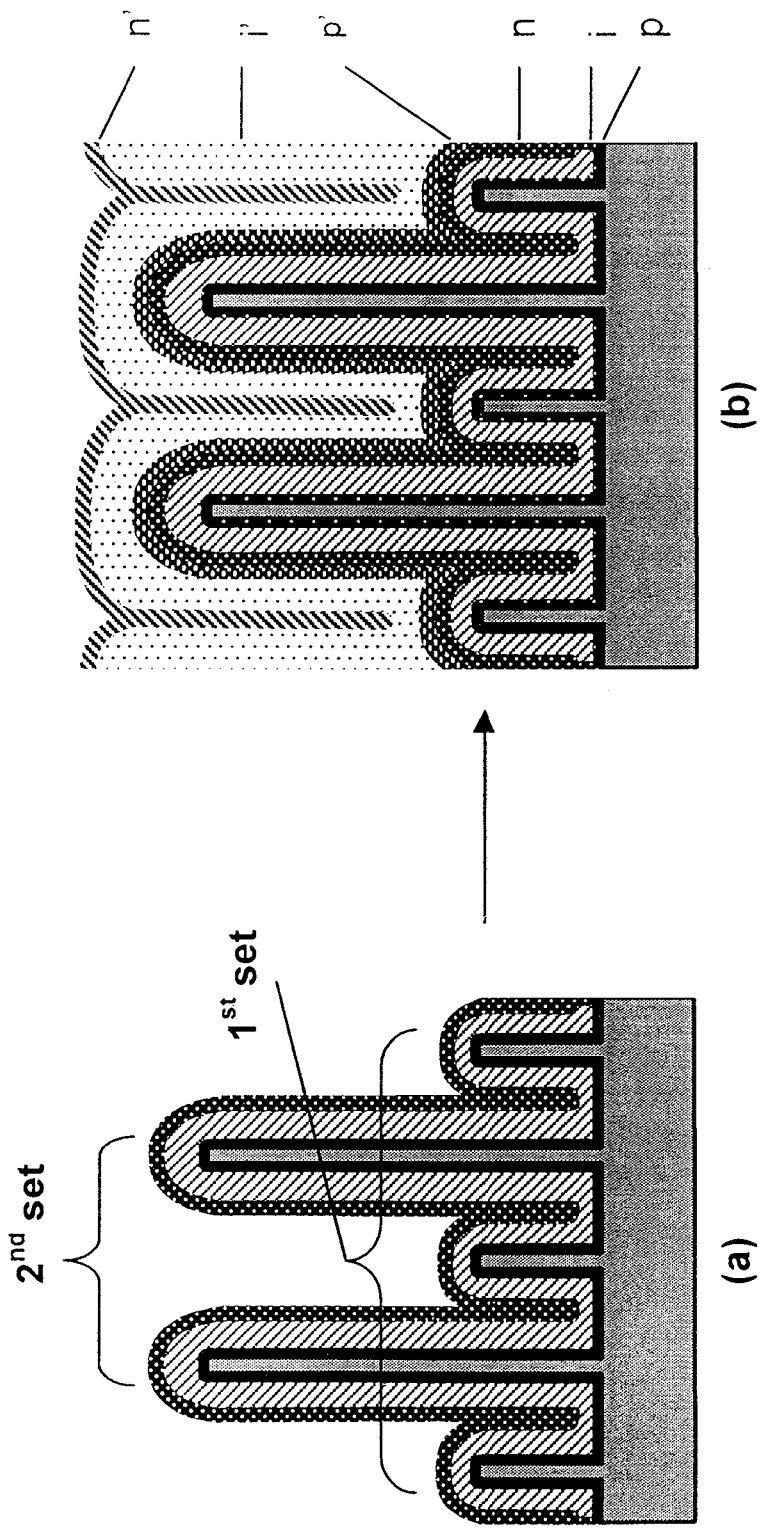
FIG. 9 shows the cross-sectional views of a TYPE II vertical structured multi-junction PV device in accordance with the present invention.

In a fourth embodiment of the present invention represented in FIG. 9 (right), a Type II tandem or multi-junction photovoltaic device is disclosed having at least two sub-cells with vertical p-n or p-i-n junctions; wherein the vertical p-n or p-i-n junctions are formed as a result of substantially conformal deposition of layers of films on a structured substrate represented in FIG. 6 (right); and wherein the elongated structures on the structured substrate form n sets (where n>1). For example, FIG. 6 (right) illustrates a structure having first and second sets of elongated structures as shown. Each set differs from the others at least by its dimension along the protruding direction. The number of sets, n, equals the maximum number of sub-cells of vertical junctions that are possible. The elongated structures are preferred to have substantially uniform pitch (d1, d2) and height (h1, h2), and may be made of a conductor, or a semiconductor, or an insulator. Each individual sub-cell, including structured sub-cells, contains a p-n or p-i-n junction, which consists of a p-doped semiconductor, an optional non-doped semiconductor and an n-doped semiconductor.

Figure 12:
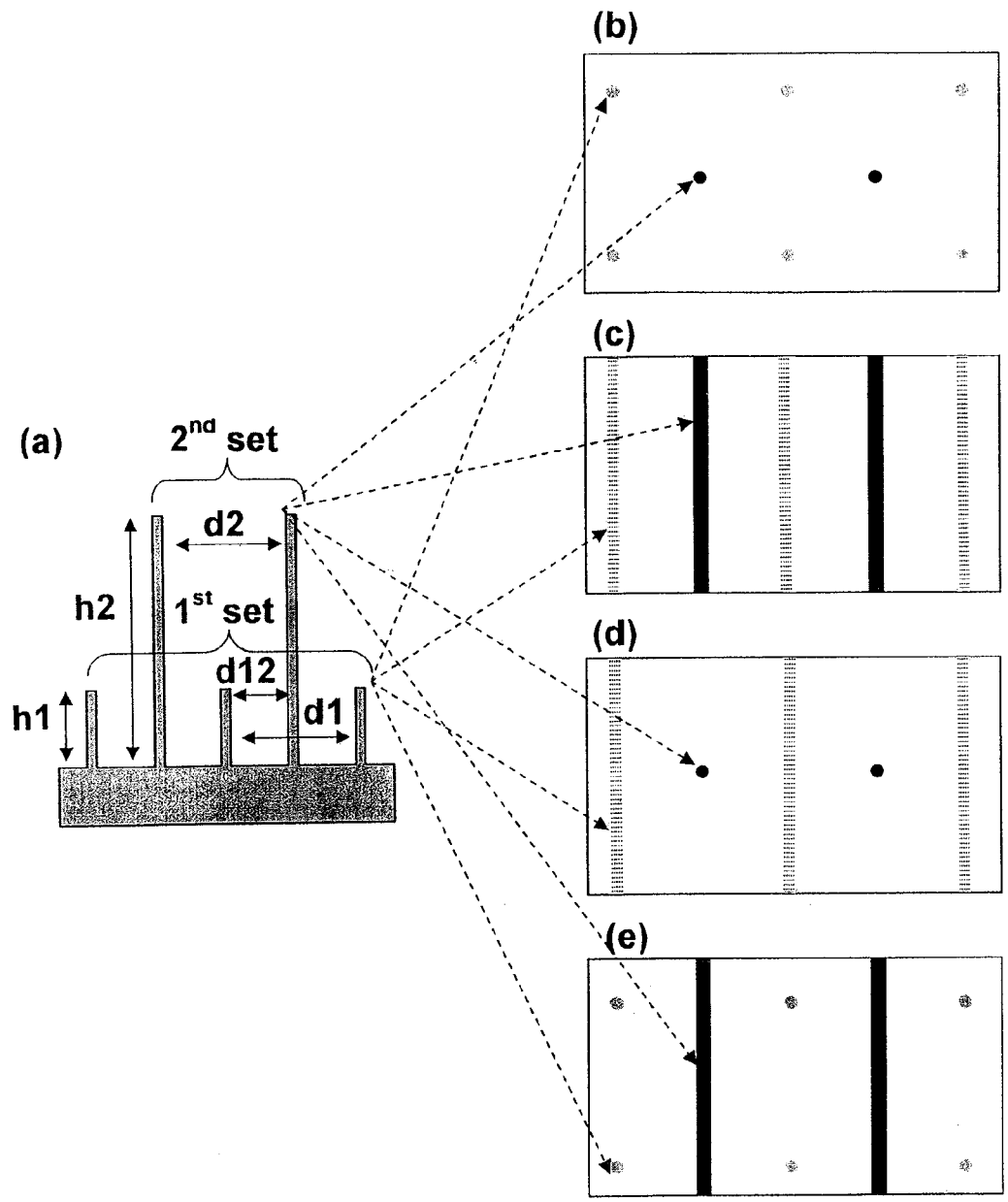
FIG. 12 shows different possible structural configurations of a TYPE II structured substrate from top view in accordance with the present invention.

FIG. 12 gives one example of such a Type II structured substrate where number of sets n is equal to 2. The side view shown in FIG. 12(a) can represent either two sets of pillar structures as shown in top view in FIG. 12(b), or two sets of fin structures as shown in top view in FIG. 12(c), or a set of fin structures together with a set of pillar structures as represented in the top views of FIGS. 12(d) and 12(e). Usually the structures of FIGS. 12(b) and 12(c) are preferred as they are relatively easier to make compared with the structures of FIGS. 12(d) and 12(e). The pitch of the structures belonging to different sets obeys the equation: $d1/a1=d2/a2=\ldots=dn/an$, where $1, 2, \ldots, n$ are the labels assigned to each set; $d1, d2, \ldots, dn$ are the distance between the structure and its nearest neighbour or second nearest neighbour within the corresponding set, and $a1, a2, \ldots, an$ are any integer numbers.

Figure 13:
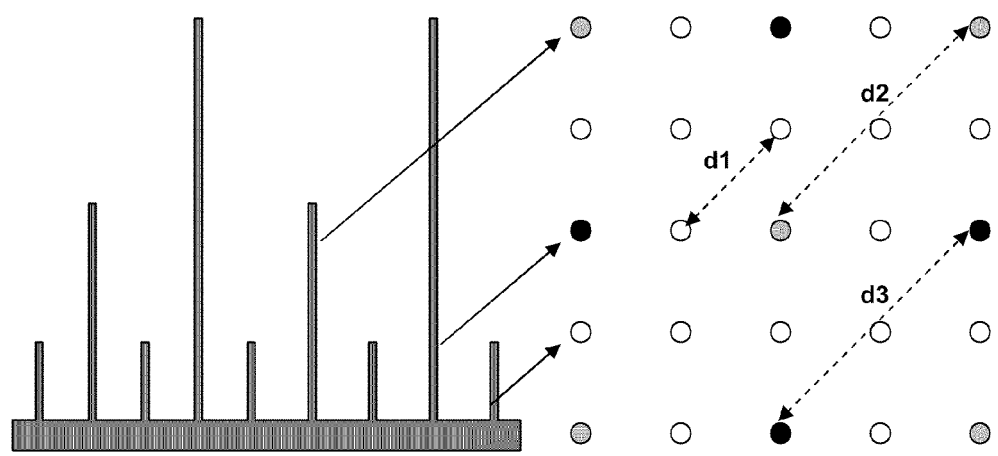
FIG. 13 shows the structural configuration of a TYPE II structured substrate form top view in accordance with the present invention.

Further extension in number of sets to achieve more vertical junction sub-cells is possible, and FIG. 13 shows one example when n equals to three. In this case, $d1/1=d2/2=d3/2$, where d1, d2 and d3 are as labelled.

Figure 14:
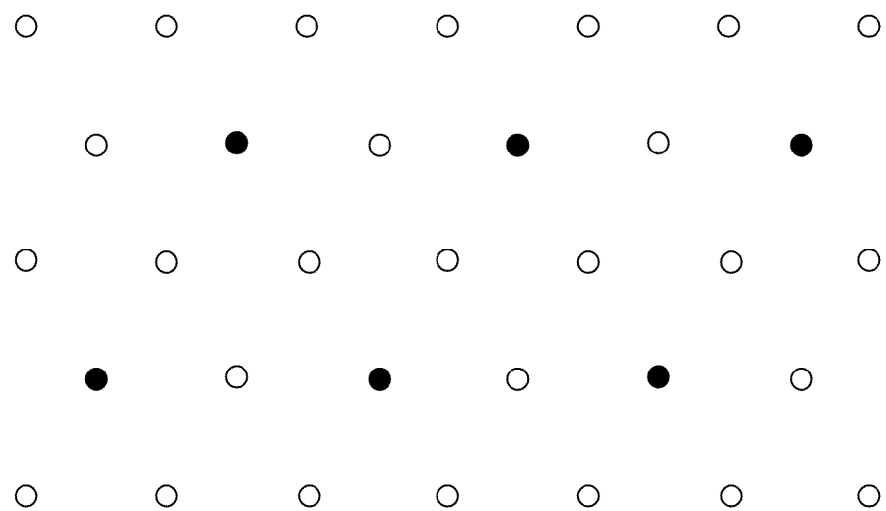
FIG. 14 shows a triangular lattice configuration of a TYPE II structured substrate form top view in accordance with the present invention.

In the case where structures are sets of pillars, the pillars can be arranged in the lattice configuration other than squares. FIG. 14 illustrates an example of a triangular lattice when viewed from above.

Figure 15:
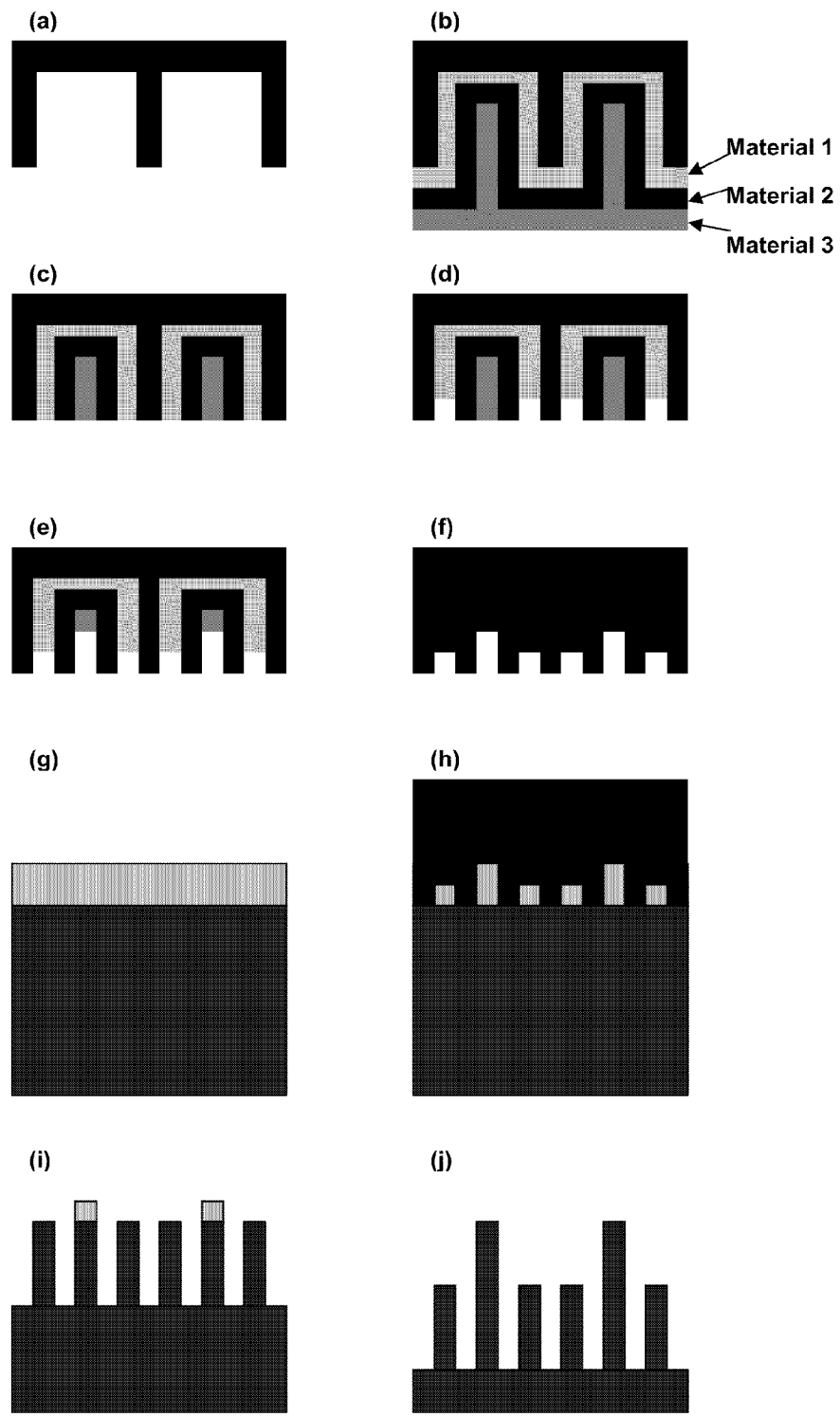
FIG. 15 shows an example of the process flow to form TYPE II structured substrate in accordance with the present invention.

One method of fabricating a Type II structure is shown in FIG. 15. Firstly, an imprinting stamp is fabricated using a suitable method so that the stamp has regular trenches of two different depths on its surface. For example, this can be done by PEDAL process (Planar Edge Defined Alternate Layers. For further information about the process, please refer to "Wafer scale aligned sub-25 nm metal nanowires on Silicon using PEDAL lift-off process", *NSTI-Nanotech* 2005 Vol 3), in which the stamp is firstly etched to form regular trenches on its surface as represented in FIG. 15(a), and then alternating layers of different material are deposited onto the stamp to fill the trenches as represented in FIG. 15(b). The surface of the stamp on which the materials are deposited is planarized afterwards to ensure each deposited layer is exposed as represented in FIG. 15(c). Further treatment by two subsequent selective etchings, where each etching only etches away one kind of material, and the depth of each material being etched has to be different from the other, gives the stamp regular trenches with two different depths on its surface as represented in FIGS. 15(d) and 15(e). An optional protecting coat can be applied to the imprinting stamp after forming the desired structure as represented in FIG. 15(f). Once the imprinting stamp is prepared, a substrate is coated with a thin layer of resist using suitable method such as spin-coating as represented in FIG. 15(g). The coated resist is then imprinted by the prepared stamp as represented in FIG. 15(h), in the mean time, heat or UV radiation can be applied to the substrate to help cure the resist, so that the reversed structural features on the surface of the stamp are transferred to the resist layer. The resist layer is now consisting of regular lines with two different heights, which is defined by the depth of the trenches on the stamp. The substrate with the remaining resist is going through a suitable an-isotropic etching process, which only etches the substrate itself. The remaining resist serves as an etching mask to protect the material beneath it, hence two different heights of the line resist will define two different heights of fins on the substrate during the etching represented in FIGS. 15(i) and 15(j). The resulting structures can be further thinned via suitable method such as isotropic etching.

Figure 16:
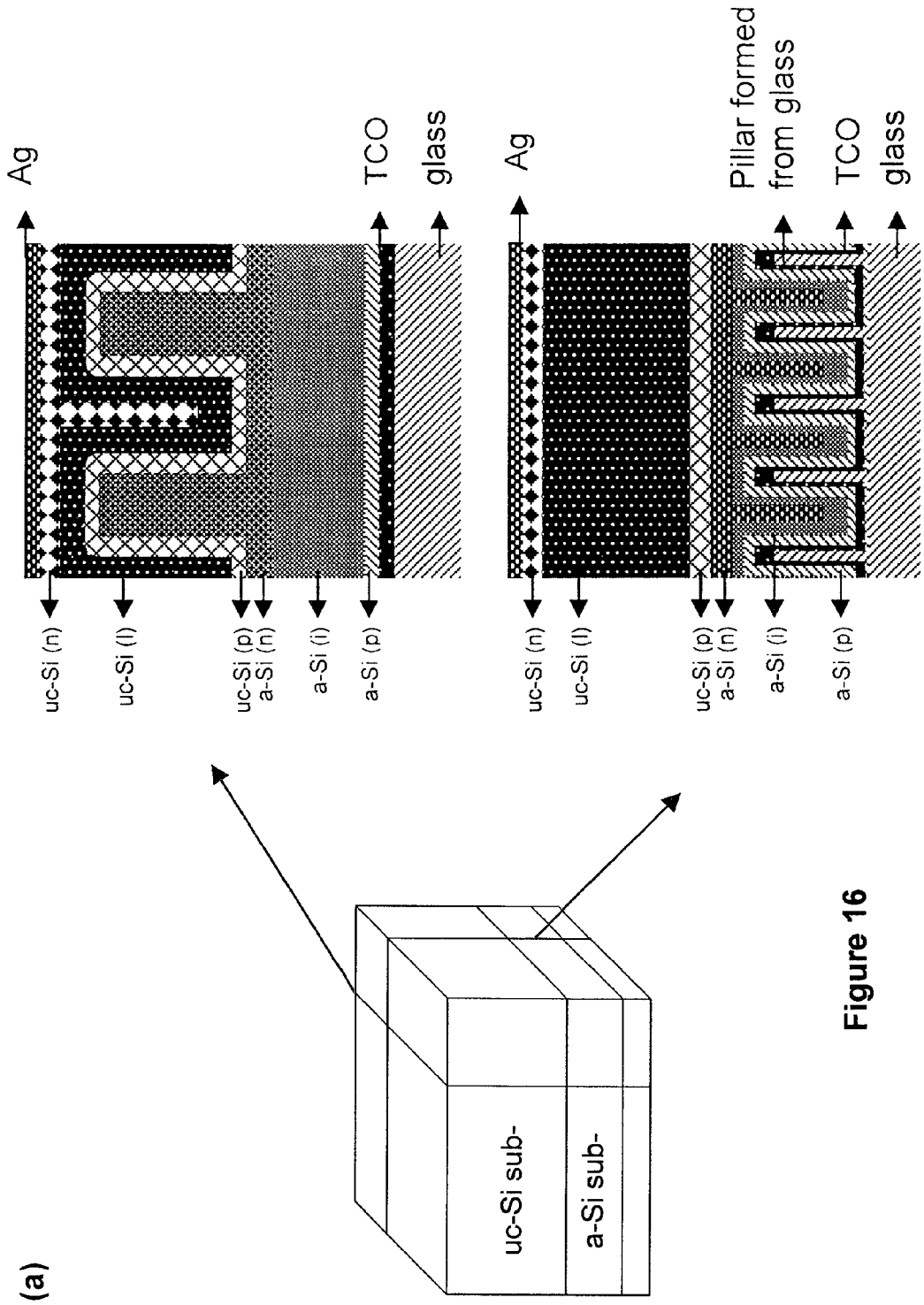
FIG. 16 shows cross-sectional views of two preferred vertical structured multi-junction PV device in accordance with the present invention.
Figure 16:
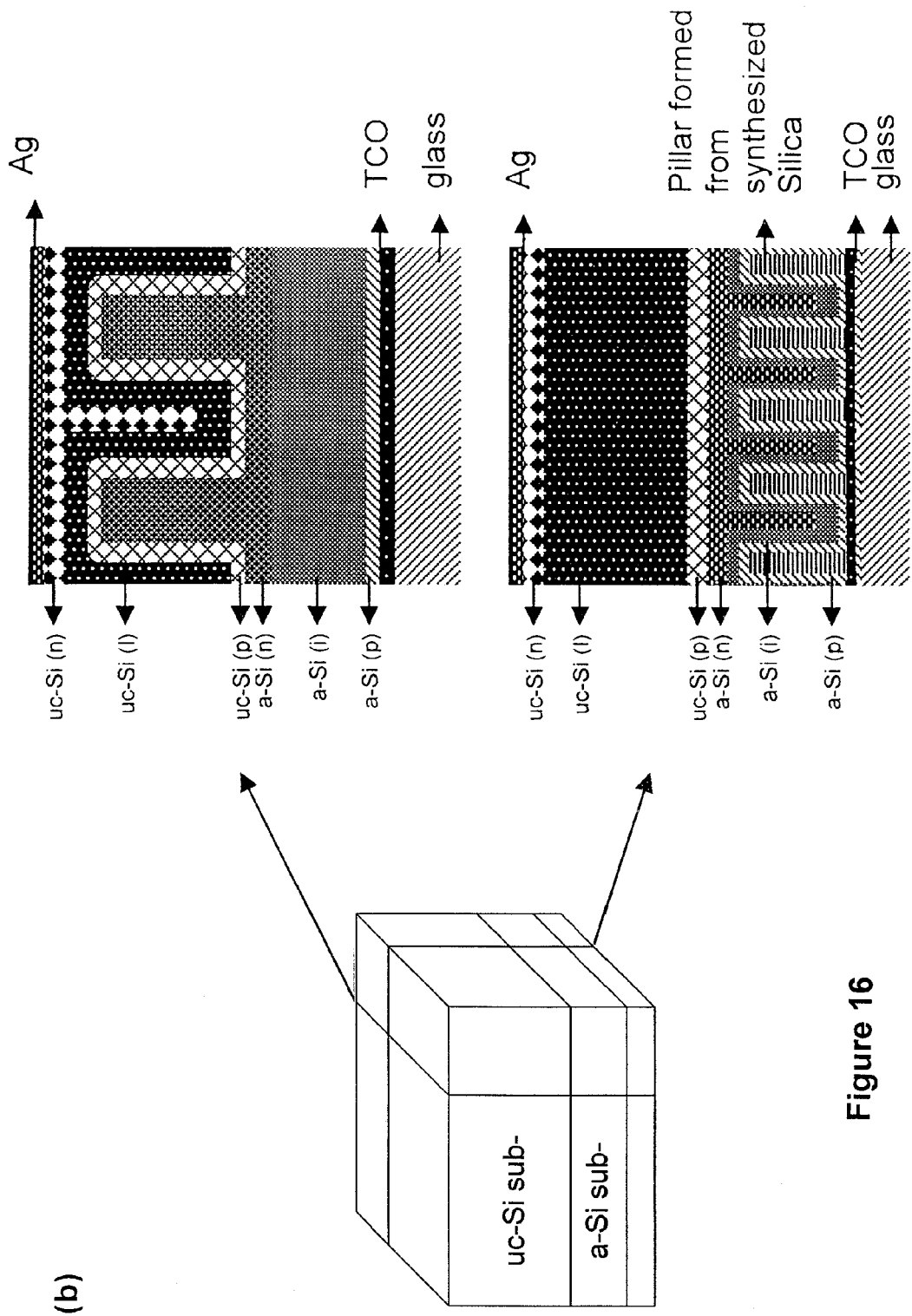

An example of photovoltaic device based on this invention is a Type I vertical junction silicon thin film tandem solar cell FIG. 16(a), where the structured substrate is a structured glass sheet. The surface of the structured glass sheet is coated with TCO (transparent conducting oxide), the bottom cell (first sub-cell) is made of p-doped, non-doped and n-doped amorphous silicon, while the upper cell (second sub-cell) is made of p-doped, non-doped and n-doped microcrystalline silicon. The preferred structure configurations for a-Si/μc-Si tandem cell in the case of Type I structure are: the bottom fin structures have a pitch in the range of 500 nm~1 μm, and a height in the range of 500 nm~2 μm, while the top pillar structures have a pitch in the range of 1 μm~5 μm, and a height in the range of 2 μm~10 μm; or in the case of a Type II structure, the first set of pillars which contributes to the bottom a-Si sub-cell has a preferred pitch in the range of 500 nm~1 μm, and a height in the range of 500 nm~2 μm, while the other set of pillars which contributes to the top μc-Si sub-cell has a preferred pitch in the range of 1 μm~5 μm, and a height in the range of 2 μm~10 μm.

Another example of photovoltaic device is similar to that described above, but instead of using a structured glass substrate, it uses a substrate which is a piece of planar glass coated with TCO (transparent conducting oxide) and synthesized silica as represented in FIG. 16(b). The desired structured feature is formed from the synthesized silica layer, around which the subsequent structured sub-cells are formed. The TCO layer sitting beneath the structure is one of the electrodes that extracting the charges, while glass serves the purpose of mechanical supporting.

Although a-Si and μc-Si are the deposited semi-conductor material mentioned in this invention; other materials can also be applied where a benefit would be gained by the use of the present invention, for example: SiGe, SiC, Ge, III-V semiconductors, II-VI semiconductors, C etc.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A vertical multi-junction photovoltaic device, comprising:
   a structured substrate including a plurality of substantially vertical elongated structures protruding from a planar surface of the structured substrate, wherein an areal density of conformal layers forming p-n or p-i-n junctions of the elongated structures at a first sliced plane parallel to the planar surface is different than an areal density of conformal layers forming p-n or p-i-n junctions of the elongated structures at a second sliced plane parallel to the planar surface; and
   at least a first sub-cell and a second sub-cell, each having a different vertical p-n or p-i-n junction formed of different conformal layers, the first sub-cell being formed in a first region incorporating the first sliced plane having elongated structures with conformal layers forming p-n or p-i-n junctions of a first areal density and the second sub-cell being formed above the first sub-cell in a second region incorporating the second sliced plane having elongated structures with conformal layers forming p-n or p-i-n junctions of a second areal density.

2. The device according to claim 1, wherein each of the elongated structures has a cross-sectional area at the first sliced plane which is different from a cross-sectional area at the second sliced plane.

3. The device according to claim 1, wherein each of the elongated structures includes a discontinuity in its structural dimensions in a plane parallel to the planar surface, and the discontinuity defines a boundary between the first region and the second region.

4. The device according to claim 1, wherein the elongated structures are uniformly spaced.

5. The device according to claim 1, wherein the elongated structures have the same structural dimensions.

6. The device according to claim 1, wherein each elongated structure comprises a substantially vertical fin in the first region and at least one substantially vertical pillar formed on top of the fin in the second region.

7. The device according to claim 6, wherein a plurality of substantially vertical pillars are formed on top of each fin, and a spacing between neighboring pillars on a same fin is larger than a spacing between neighboring fins.

8. The device according to claim 7, wherein a height of the pillars is more than half the difference between the spacing between neighboring pillars on the same fin and the spacing between neighboring fins.

9. The device according to claim 6, wherein a height of the fins is more than half of a spacing between the fins.

10. The device according to claim 1, wherein each elongated structure comprises a wider pillar in the first region and a narrower pillar formed on top of the wider pillar in the second region.

11. The device according to claim 1, wherein each elongated structure comprises a wider fin in the first region and a narrower fin formed on top of the wider fin in the second region.

12. The device according to claim 1, wherein the elongated structures form n sets (where n>1) and each set differs from the other sets at least by dimension along the protruding direction, the first sliced plane incorporating a plurality of the n sets of elongated structures and the second sliced plane incorporating less than the plurality of n sets of elongated structures.

13. The device according to claim 12, wherein the device comprises n sub-cells, and each sub-cell is a vertical p-n or p-i-n junction formed of conformal layers formed in relation to a corresponding set of the elongated structures.

14. The device according to claim 12, wherein the elongated structures in each of the n sets are either substantially vertical pillars or substantially vertical fins.

15. The device according to claim 14, wherein a first set of the n sets comprises substantially vertical pillars and a second set of the n sets comprises substantially vertical pillars.

16. The device according to claim 14, wherein a first set of the n sets comprises substantially vertical fins and a second set of the n sets comprises substantially vertical fins.

17. The device according to claim 14, wherein a first set of the n sets comprises substantially vertical pillars and a second set of the n sets comprises substantially vertical fins.

18. The device according to claim 12, wherein a pitch of the elongated structures belonging to different sets obeys the equation:

$$d1/a1 = d2/a2 = \ldots = dn/an,$$

where $1, 2, \ldots, n$ are the labels assigned to each of the n sets; $d1, d2, \ldots, dn$ are the distance between the respective elongated structure and its nearest neighbor or second nearest neighbor within the corresponding set, and $a1, a2, \ldots, an$ are any integer numbers.

19. The device according to claim 12, wherein the elongated structures of each set are arranged in a lattice.

20. The device according to claim 1, wherein a volume between the elongated structures in the first region is filled by the conformal layers making up the first sub-cell.

21. The device according to claim 1, wherein a volume between the elongated structures in the second region is filled by the conformal layers making up the second sub-cell.

22. The device according to claim 1, wherein the vertical junctions of the first and second sub-cells are interlaced.

23. The device according to claim 1, wherein the elongated structures are formed of a conductor, semiconductor, insulator, or combination thereof.

24. A method of making a vertical multi-junction photovoltaic device, comprising: forming a structured substrate including a plurality of substantially vertical elongated structures protruding from a planar surface of the structured substrate, wherein an areal density of conformal layers forming p-n or p-i-n junctions of the elongated structures at a first sliced plane parallel to the planar surface is different than an areal density of conformal layers forming p-n or p-i-n junctions of the elongated structures at a second sliced plane parallel to the planar surface; forming at least a first sub-cell and a second sub-cell, each having a different vertical p-n or p-i-n junction formed by depositing different conformal layers of material on the structured substrate, the first sub-cell being formed in a first region incorporating the first sliced plane having elongated structures with conformal layers forming p-n or p-i-n junctions of a first areal density and the second sub-cell being formed above the first sub-cell in a second region incorporating the second sliced plane having elongated structures with conformal layers forming p-n or p-i-n junctions of a second areal density.

25. The method according to claim 24, comprising forming the structured substrate by:
   patterning on an original substrate a first set of line masks and a second set of line masks orthogonal to the first set of line masks;
   removing portions of the first set of line masks not covered by the second set of line masks;
   selectively anisotropically etching portions of the original substrate not covered by the second set of line masks to form a pattern of fins;
   removing the second set of line masks to expose the remainder portions of the first set of line masks; and
   selectively anisotropically etching portions of the original substrate not covered by the remainder portions of the first set of line masks to form pillars on top of fins, the fins incorporating the first sliced plane and the pillars incorporating the second sliced plane.

26. The method according to claim 25, further comprising thinning the fins and the pillars on top of the fins.

27. The method according to claim 24, comprising forming the structured substrate by:
   fabricating an imprinting stamp having regular features of at least two different depths on a surface;
   coating an original substrate with a thin layer of curable resist;
   imprinting the coating with the surface of the imprinting stamp;
   curing the resist to transfer the reversed features of the imprinting stamp to the original substrate; and
   anisotropically etching the original substrate to produce at least first and second sets of the elongated structures, each set having a different height,
   wherein the first sliced plane incorporates at least the first and second sets of the elongated structures, and the second sliced plane incorporates less than the first and second sets of elongated structures.

* * * * *